United States Patent [19]

Moraw

[11] 4,281,049
[45] Jul. 28, 1981

[54] COLOR SEPARATION TRANSPARENCY AND PROCESS FOR THE PREPARATION THEREOF

[75] Inventor: Roland Moraw, Wiesbaden, Fed. Rep. of Germany

[73] Assignee: Hoechst Aktiengesellschaft, Frankfurt am Main, Fed. Rep. of Germany

[21] Appl. No.: 48,159

[22] Filed: Jun. 13, 1979

[30] Foreign Application Priority Data

Jun. 16, 1978 [DE] Fed. Rep. of Germany ....... 2826380

[51] Int. Cl.³ ............................................... G03C 5/04
[52] U.S. Cl. ...................................... 430/9; 430/356; 430/396; 350/162 SF
[58] Field of Search .................. 430/4, 9, 356, 6, 396; 350/162 SF, 317

[56] References Cited

U.S. PATENT DOCUMENTS

| | | | |
|---|---|---|---|
| 2,114,325 | 4/1938 | Wilkinson | 430/356 |
| 2,123,830 | 7/1938 | Groesbeck | |
| 2,842,610 | 7/1958 | Crosfield et al. | 430/356 |
| 2,971,841 | 2/1961 | Moore | 430/4 |
| 3,144,333 | 8/1964 | Waldherr | 430/4 |
| 3,488,190 | 1/1970 | Smith | 430/356 |
| 3,663,221 | 5/1972 | Higgins et al. | 430/356 |
| 3,745,037 | 7/1973 | Bowker | 430/356 |
| 3,947,105 | 3/1976 | Smith | 350/182 SF |
| 4,057,326 | 11/1977 | Knop | 350/182 SF |
| 4,159,164 | 6/1979 | Dammann | 350/182 SF |

FOREIGN PATENT DOCUMENTS

940622 3/1956 Fed. Rep. of Germany.
1921460 4/1970 Fed. Rep. of Germany.
2703160 7/1977 Fed. Rep. of Germany.

OTHER PUBLICATIONS

Hennig, Siemens Zeitschrift, vol. 49, No. 8, pp. 522–527, (1975).
Gale, SMPTE Journal, Jan. 1978, pp. 6–8.
Knop, Optics Communications, vol. 18, pp. 298–303, Aug. 1976.

*Primary Examiner*—J. Travis Brown
*Attorney, Agent, or Firm*—Schwartz, Jeffery, Schwaab, Mack, Blumenthal & Koch

[57] ABSTRACT

Disclosed is a color separation transparency of a partial image in one of the primary colors blue, green, yellow or red or in black or white color or in a secondary color, which comprises the partial image in a negative of the color separation transparency being transparent in the particular primary or secondary color, and the areas of the color separation transparency outside the part image being opaque. Also disclosed is a process for preparing the color separation transparencies according to the invention.

13 Claims, 5 Drawing Figures

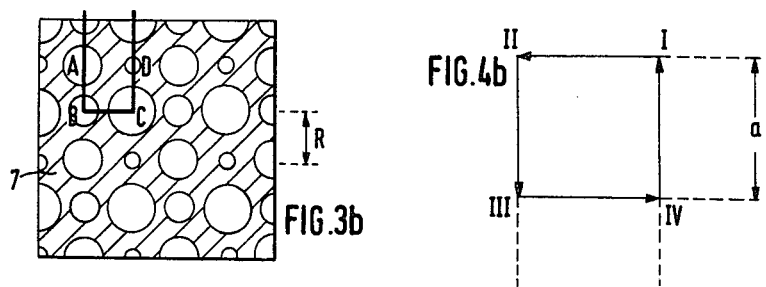
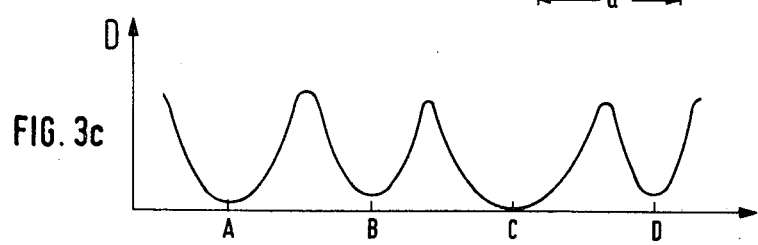
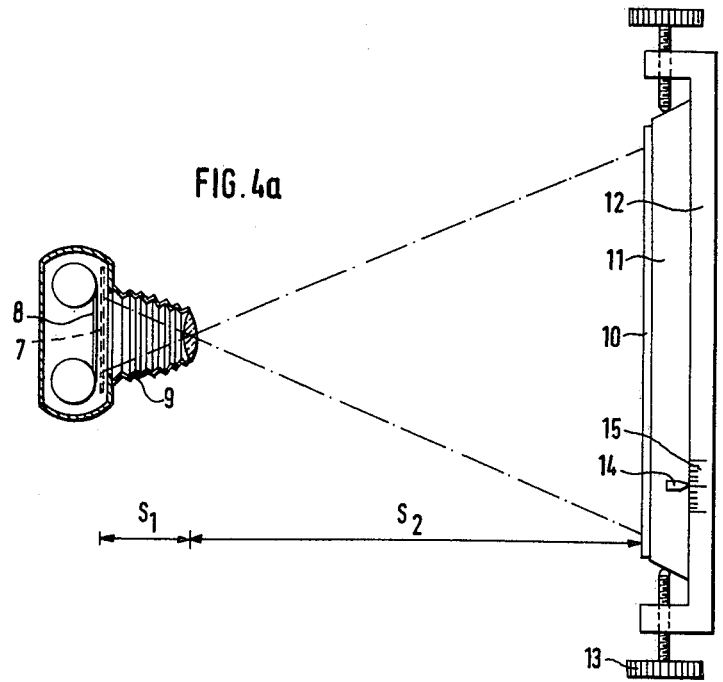

COLOR SEPARATION TRANSPARENCY AND PROCESS FOR THE PREPARATION THEREOF

BACKGROUND OF THE INVENTION

The present invention relates to a color separation transparency of a partial image in one of the primary colors blue, green, yellow or red or in black or white color, and to processes for the preparation thereof.

Color separation transparencies of this type are used for the preparation of relief structures in the plane of a recording material, from which embossing matrices are taken. By means of these embossing matrices for example, relief images are embossed in polyvinyl chloride films, and these relief images on projection give a multicolored image of the original for the color separations.

Grid-wise screened images are produced by the ZOD (Zero-Order-Diffraction) technique which is known from the journal LASER u. Elektro-Optik No. 3/1976, pages 16/17. Three nickel matrices are produced from the relief images which, for example, correspond to three main color grid patterns in three photo-lacquer layers, and these matrices are used to emboss colorless thermoplastic films of polyvinyl chloride. These films are mechanically superposed. On projecting the superposed embossed images, using conventional projectors, colored projection images are obtained from the colorless relief images. The grid-like structuring is accomplished with relief grids of rectangular cross-section, the grid period being about 1.5 $\mu$m. One nickel matrix of different relief depth is made for each color separation in yellow, magenta and cyan, having relief depths of about 1.2 $\mu$m, 1.5 $\mu$m and 1.8 $\mu$m respectively, and the separate embossed images are generated using these matrices. The embossed images are superposed to give a three-layer relief image, from which colored images can be projected.

A disadvantage which makes the acceptance of this technique more difficult is the expensive preparation process with three completely separate working steps for making the individual embossed relief grids corresponding to the color separation. A further serious disadvantage is the necessary composing of the three separate relief images in true register to give the duplicate image required for the colored projection.

To overcome this disadvantage, it is proposed in German Patent Application No. P 26 57 246.3 (corresponding to U.S. application Ser. No. 861,491, filed Dec. 16, 1977 to compose the relief image in one plane from several relief partial images which are adjacent but do not overlap and have different grid depths. A further development of this technique is described in German Patent Application No. P 27 34 581.9 (corresponding to U.S. application Ser. No. 928,700, filed July 27, 1978), according to which grid structures for at least four projection colors, for example yellow, red, blue-violet and green, are used. White color is represented by grid-free partial areas. It was proposed to obtain black partial images by means of statistically random relief structures of 1-2 $\mu$m depth.

To produce relief images of this type in one plane, German Patent Application No. P 27 34 580.8 (corresponding to U.S. application Ser. No. 928,701, filed July 27, 1978) describes a method in which the photo-lacquer layer is grid-wise exposed for the projection color green through to the greatest grid depth, and the grid depths of the partial images are then reduced down to the depths necessary for the particular desired projection color red, yellow, blue or white by exposure through color separations. For the color white, the grid structure must be almost completely removed. The green partial image areas are not exposed again since, as mentioned above, the greatest grid depth for the projection color green has already been fully exposed.

SUMMARY OF THE INVENTION

It is an object of the present invention to provide improved color separations for the grid-wise exposure of a recording layer having several projection colors.

It is another object of the present invention to provide a process for the preparation of color separations of this type.

In accomplishing the foregoing objects, there has been provided according to one aspect of the present invention a color separation transparency of a partial image in one of the primary colors blue, green, yellow or red or in black or white color or in a secondary color, which comprises the partial image in a negative of the color separation transparency being transparent in the particular primary or secondary color, and the areas of the color separation transparency outside the part image being opaque. The color separation transparency comprises screening which is either of a single periodicity for one of the primary colors by screen elements of the same type, or of a multiple periodicity for a secondary color, having multiply repeating units of screen elements which differ from one another and are distinguished from one another by their densities and their screen dot apertures.

In accordance with another aspect of the present invention, there has been provided a process for the preparation of a color separation transparency of the abovedefined type from an original, which comprises the steps of exposing the original to a photographic film with light of the color complementary to the desired primary color of the color separation to produce a color separation positive, and reprinting the resulting color separation positive to give a color separation negative. Preferably, this is carried out with the aid of color separations for cyan, magenta and yellow, and comprises the step of obtaining the color separation transparency for the desired primary color yellow, red, blue and green by masking the color separation negative for yellow, magenta and cyan or masking the superposed color separation negatives for yellow and cyan with the color separation positives of the remaining colors, including the positives for the colors black and white.

Other objects, features and advantages of the invention will become apparent from the detailed description of preferred embodiments which follows, when considered together with the attached figures of drawings.

BRIEF DESCRIPTION OF THE DRAWINGS

In the drawings:

FIGS. 1b to 1g show color separations for the individual primary colors of the original according to FIG. 1a;

FIG. 2b shows the color separation negative corresponding to the original according to FIG. 2a;

FIG. 3b shows a screen film formed from the four screen films according to FIG. 3a by copying onto a recording material, with offsets by fractions of a screen period;

FIG. 3c shows the optical density along the one-dimensional complex A-B-C-D in FIG. 3b;

FIG. 4a shows the principle of an arrangement for obtaining color separations with the aid of the screen film according to FIG. 3b;

FIG. 4b shows a schematic representation of the cyclic offset of the original in a closed path;

DETAILED DESCRIPTION OF PREFERRED EMBODIMENTS

Figure 1A:
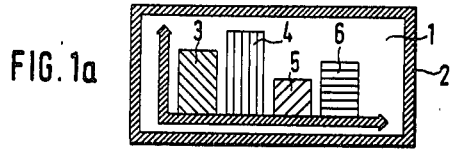
FIG. 1a shows a schematic graphical representation of an original which contains several primary colors.

In FIG. 1a, an example is graphically represented schematically, wherein the partial images in the colors white, black, green, red, yellow and blue are marked in the order given with the reference numerals 1 to 6.

There are various possibilities for preparing color separations. If the original according to FIG. 1a is prepared by drawing, partial images which correspond to the color separations and which are photographed individually under identical exposure conditions, can be produced on image carriers which are true to scale, such as polyester films.

Likewise, synthetic preparation is possible, which is to be understood as meaning that techniques, such as computer printouts or graphical representations or electronic drawing techniques, are used.

For the photographic preparation of color separations, the color separations are in general taken on panchromatic film with light of complementary color, and the large-area original is in most cases reduced. Customarily, color separations are prepared for subtractive color formation and a black separation is made in addition. Subtractive color formation takes place in such a way that each color separation works as an image-wise color filter in one of the primary colors and the individual color filter areas are mutually superposed.

Additive color formation takes place with the four colors yellow, red, blue and green, which cover the range of the visible spectrum largely without gaps. Secondary colors are produced by interlacing of screen elements of different colors from these four primary colors, the color intensity being represented by the proportion of colored area in the screen element.

These color separations must be adapted to the recording technique by suitable masking. Furthermore, a white separation is also produced by an exposure with white light. The table which follows contains the subtractive color separation which are to be combined. A "negative" is here a picture in which the partial image is transparent in one primary color, while in a "positive", the picture appears correspondingly opaque.

The colors yellow, red, blue and green are represented by the primary colors yellow, magenta and cyan. The separations for black and white are also added to these.

| COLOR SEPARATION | SUPERPOSITION OF COLOR SEPARATIONS |
|---|---|
| Yellow separation | yellow - negative |
| | other color separations - positive |
| Red separation | magenta - negative |

| COLOR SEPARATION | SUPERPOSITION OF COLOR SEPARATIONS |
|---|---|
| | other color separations - positive |
| Blue separation | cyan - negative |
| | other color separations - positive |
| Green separation | yellow - negative |
| | cyan - negative |
| | other color separations - positive |
| Black separation | black - negative |
| | other color separations - positive |
| White separation | white - negative |
| | other color separations - positive |

The green separation is not directly required if the starting point is a full-area relief grid having rectangular grid profiles of a grid depth of 2.2 μm and the grid depths are reduced for the other colors by exposure through the other color separations; in the green image areas, the grid ridges then remain preserved at an unchanged height. However, the preparation of a green separation is recommended for the combinations of color separations indicated in the table.

Figure 1B:
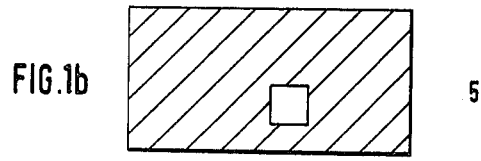
Figure 1C:
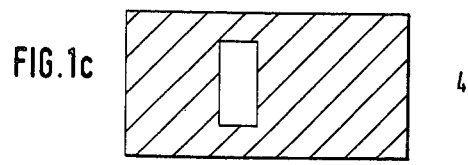
Figure 1D:
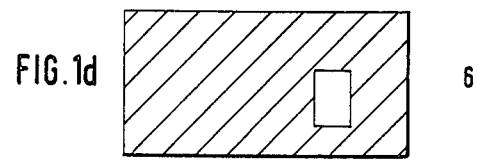
Figure 1E:
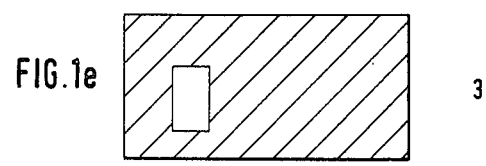
Figure 1F:
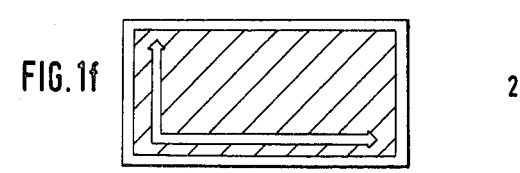
Figure 1G:
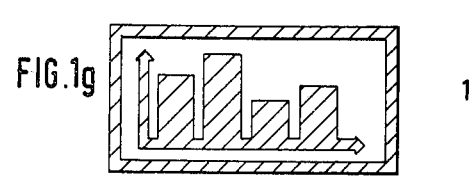

The color separations are schematically shown for yellow in FIG. 1b, for red in FIG. 1c, for blue in FIG. 1d, for green in FIG. 1e, for black in FIG. 1f and for white in FIG. 1g.

To prepare the color separations, the image which is to be reproduced is taken in the conventional manner with colored light as a screened image or as a half-tone image on silver film. The four color separation exposures are effected with light in the wavelength ranges of 430–480 nm, 510–540 nm, 570–600 nm and 610–640 nm. The half-tone pictures on silver film negatives or silver film positives are then screened by once or twice recopying through a contact screen. To increase the contrast, it is an advantage here if a recording material of sensitometrically very hard gradation, for example, a recorded material of polyester/aluminum/copying lacquer, is used for recopying.

It is essential that, in each color separation, the screen dots are positioned at identical points relative to the image and that when all the color separations are superposed in true register, the screen dots do not overlap, since each screen element on the grid image should contain only one color information. To fulfill the latter condition, the exposure times in recopying through a contact screen can be lengthened or shortened correspondingly, as a result of which screen dots are reduced to a greater or lesser extent in the desired manner.

White image areas are obtained when the corresponding screen elements are transparent in all the color separations and are thus irradiated during each exposure through a color separation. Resulting from this overexposure, the grid structure is undermined by radiation in such a way and reduced on development to such an extent that a color no longer appears on projection. Black image areas are protected by a black separation against excessive exposure during the exposure through the other color separations. The black separation can here have the form of a diffusing film at the same time so that the particular image area appears dark in the projection.

A characteristic feature of these color separations, in which they generally differ from those for subtractive color formation, is the complete opacity when superposed in pairs. This can be seen, for example, when superposing the partial images according to FIGS. 1b and 1c or FIGS. 1c and 1d and so on. Whenever two color separations are superposed in true register with the aid of registering pins or registering marks, no transparent area remains so that it is easy to check, without special aids, whether the preparation of the color separations was exact.

A further feature of the correct formation of the color separations is that, when all the color separations are superposed in a chronological sequence with intermediate exposure of the recording layer, complete transparency of the recording layer is achieved. This feature can be seen from the superposition of the partial images according to the FIGS. 1b to 1g. In a simple checking procedure, a check is made whether the recording material has been uniformly exposed over the entire image area, after the color separations have been placed successively in true register onto a light-sensitive recording material in a contact arrangement and after exposure has taken place. The checking procedure is easy in the case of diazotype films which permit working under yellow safety light. In this case, the exposure must be effected under UV light. After developing with ammonia, the diazotype film must remain colorless. Areas on the diazotype film, which have become dark on development, show that the formation of the color separations was defective.

Figure 2A:
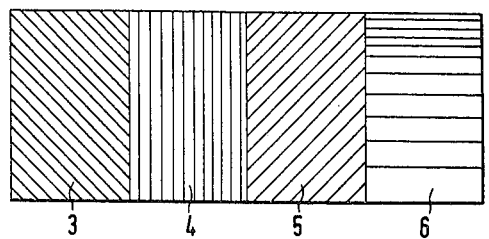
FIG. 2a shows an original with a decrease in color intensity from the top to the bottom.

The two characteristic features of suitable color separations, namely complete opacity when any pair of color separations is superposed and comlete transparency when all the color separations are successively superposed, also apply to screened color separations, independently of the particular preparation process of the color separations. In the simplest case, the screening only reduces the color intensity, as can be seen, for example, in the original according to FIG. 2a, which has a decrease in intensity in the field for the blue color 6 from blue via light blue to colorless or white in the direction from top to bottom. Again, photographic film is exposed under the color separations with complementary light, with the degree of transparency with the color intensity.

Figure 2B:
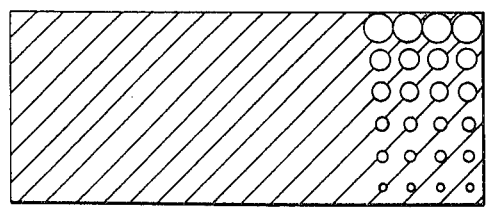

Masking in a reprocamera can be effected by superposition in true register of color separation transparencies which are photographed together with simultaneous screening and, in general, concomitant reduction. A color separation positive for blue is obtained, which is recopied to give a color separation negative, as shown schematically in FIG. 2b. The color separation transparencies for the other colors are prepared correspondingly.

To ensure that the screen dots on the relief grid image are on a colorless background and thus reproduce only gradations of color intensity, the following preparation process is preferred for the white separation: the color separation negatives, which can also be screened, for yellow, red, blue, green and black are successively transferred onto a photographic film by contact exposure in true register. The resulting negative accurately represents the desired white separation.

When copying onto the deiazotype film, which is easy to handle, the color separation positives, which likewise can be screened, are the started point.

In the general case, the multi-colored originals contain secondary colors which can be represented by suitable screening and mixing of screen dots. The screen dots of the diferent color separations must, however, not overlap.

Color separations with a screen structure of this type can be obtained with the aid of color scanners by scanning the original by image dots and subsequent evaluation by computer. In addition to the partial images for black/white the color scanner must here take four color partial images for the spectral ranges 430–480 nm, 510–540 nm, 570–600 nm and 610–640 nm or, analogously to the masking technique, compute the four color partial images from the three partial images for subtractive color representation. The downstream computer must, for each image dot, establish, which of the four main colors used (i.e., green, red, yellow and blue, plus white and black) predominates and establish the magnitude of the color intensity so that an output element, for example, a light recorder, records the screen signal dots on the color separations in accordance with these values.

The color separations prepared in accordance with this technique give colored projection images with sensitometrically hard color transitions, which are similar to mosaic representations. A better color adaptation is obtained by averaging several adjacent image dots. For this purpose, for example, when representing the deep blue sky, yellow is initially suppressed by a yellow background, since only screen ground signals for blue are given as output. The suppressed yellow proportions are stored by the computer and then given as output in such a way that, for example, every third or fourth screen dot is associated with the yellow separation.

Suitable color separations can also be prepared without a programmable color scanner. Thus, a preparation using inexpensive, commercially available contact screen films is possible. Contact screen films having a periodic transmission of, for example, 48 lines/mm or 70 lines/mm are obtainable in the market as positive contact screens. Such a contact screen film of single periodicity, that is to say, having screen elements of the same type, must first be transformed in the manner indicated below into a screen film of four-fold periodicity, corresponding to the four main colors green, red, yellow and blue. In this transformed screen film, four different screen elements or arts are in an alternating periodic arrangement. Black and white are not included in this periodic structure since the areas which appear black in the projection can be superposed as irregular structures on the periodic grid structures, and the white image areas can likewise be superposed on the periodic grid structures by a full exposure. With the aid of a screen film of four-fold periodicity, a color selection for each image dot is possible during the exposure of color separations.

Figure 3A:
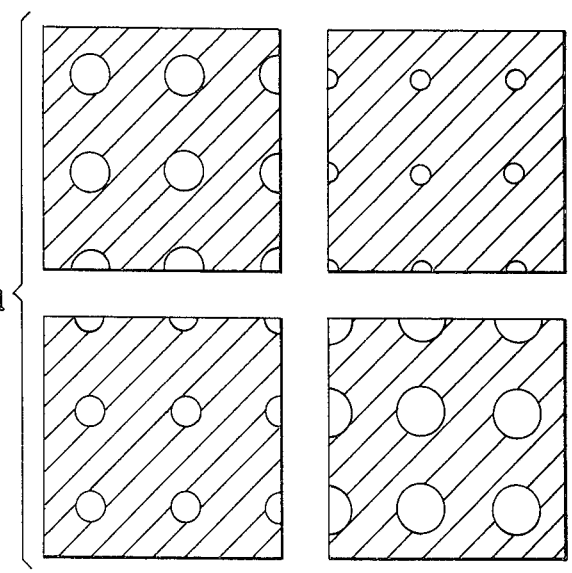
FIG. 3a shows four screen films with densities which differ from one another in each case.

To prepare a screen film of four-fold periodicity, four contact copies on a recording material are first produced from a commercially available single screen film. The individual exposure times for the contact copies are here varied so that four contact screen copies which differ in their densities and hence in the screen dot apertures are obtained, as schematically shown in FIG. 3a. These screen films are copied onto a recording material with an offset, both in the x direction and in the y direction, by half a screen period in each case. Preferably, a recording material of semsitometrically hard gradation is used. Good results are obtained with diazotype films. The end product obtained is a contact screen film 7 with a four-fold periodicity of four screen dots which differ in size and are mutually interlaced, as schematically shown in FIG. 3b. The optical density D of the contact screen film 7 along a series of lines A-B-C-D is plotted in FIG. 3c.

Any desired number of color separation exposures can be produced using the screen film 7 of four-fold periodicity. An arrangement for this purpose is schematically shown in FIG. 4a.

A camera with a photographic film 8 contains the contact screen film 7 of four-fold periodicity in a contact arrangement. A picture is taken of an original 10 which is placed on a displaceable film stage 11. The original can be a color separation film which has already been masked but not yet screened. In this case, the displaceable film stage 11 consists of a transparent focusing screen which is mounted in a frame and illuminated from the rear. The film stage 11 is displaceable in a stationary outer frame 12 in a plane parallel to itself in two mutually perpendicular directions, for example, with the aid of adjusting screws 13, only two of which are shown. One or more markers 14 on the film stage 11 and scales 15 on the outer frame 12 are used for positioning the film stage 11.

Figure 5A:
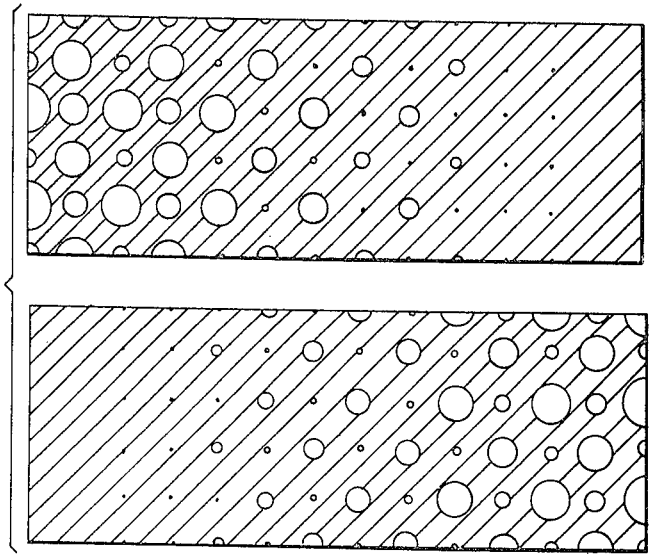
FIG. 5a shows two screened color separations for a color transition between two colors.

When the film 8 is exposed under screened color separations with simultaneous reduction, the original 10 is located, for example for taking the blue separation, in the position I in FIG. 4b. For every further color separation exposure for other colors, the position of the original 10, adhering to the film stage 11 in true register, is cyclically displaced in this order into the positions II, III and IV by a length a in each case in a closed path, in accordance with FIG. 4b. The length a is determined by the image scale $S_2/S_1$, wherein $S_1$ is the lens-to-film distance and $S_2$ is the object distance, and by the screen spacing R, drawn in FIG. 3b, on the contact screen film 7, in accordance with the equation $a=RS_2/S_1$. With an image scale of, for example, 20:1 and a screen spacing of 0.05 mm, the displacement is $a=1$ mm, a value which can be adjusted without difficulty. During the exposures, the screen film 7 remains stationary so that each image dot of the original is weighted differently with respect to intensity in the various color separations. It is thus possible to suppress small screen dots for reproductions of secondary colors in a controlled manner by varying the exposure times during the exposure of the screened color separations. They are replaced by a screen dot of another color partial image when the photo-lacquer layer, which has been pre-exposed gridwise, is exposed according to the color separations. FIG. 5a shows two screened color separation films, screened in this way, for a color transition between two colors.

Figure 5B:
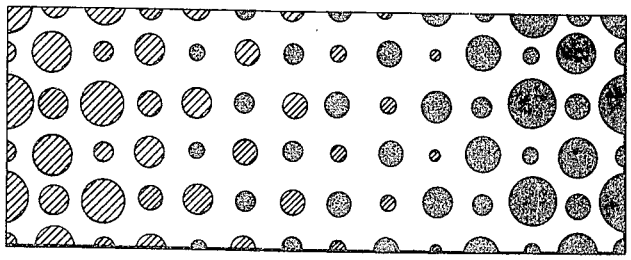
FIG. 5b shows a screen pattern on a recording layer.

FIG. 5b shows the screen pattern on a photolacquer layer after the exposure through the color separation films and through the white separation.

Mutual matching of the individual color separation transparencies for the preparation of a relief grid image for a multi-colored projection image, with the use of screen films of four-fold periodicity, is effected by means of the exposure times in the preparation of the color separation transparencies. The opacity conditions of transmission conditions must here be met. The white separation is preferably made from the combination of the other color separation transparencies. Even if the process steps are exactly adhered to, displacements of the relative color intensities are still possible, and these can be utilized in a controlled manner for largely color-matching the multi-colored projection image to the multi-colored original. This can be done in such a way that photo-lacquer layers, which have been exposed through grid structures for green, red, yellow and blue and through irregular structures for black, are exposed under positive color separation transparencies and developed. If up to five films with colored partial images are superposed in true register, it is possible to estimate, by means of the multi-colored projection images which can be obtained from these, whether further color corrections are or are not still necessary.

Results which are already adequate for single color representations are obtained when the described contact screen film of single periodicity are used as the starting point and when a cyclic displacement by half a screen dot spacing is carried out at each exposure of the color separations. The screen dots of the other color separations are thus positioned in each case between two other screen dots. Furthermore, if the area of the screen dots is kept smaller, by overexposure, than the usual area of the screen dots under normal exposure, that is to say the interspaces between the screen dots are relatively large, the interposed screen dots of the other color separations fit without overlap into these interspaces.

The measures for the preparation of color separation films for colored relief grid images in one plane must be viewed with regard to the total number of copies which can be embossed from matrices produced therefrom and which can amount to several hundred up to a thousand. It is an advantage to intensify the effort at one single point, namely at the preparation of the matrices with the aid of the color separation films, in order to be able, instead, to carry out the duplication process with the mass production of copies in the simplest manner possible. This process engineering advantage substantially outweighs any possible small reductions in the color quality when compared with subtractive color formation. In addition, in the case of single-layer relief images which have been prepared with the aid of the color separation films according to the invention, the white or colorless partial images are lighter and have fewer imperfections than in the case of multi-layer relief images since, when several films are superposed, disturbances due to, for example, scratches and dust, and light losses due to reflections on the numerous films are additive.

What is claimed is:

1. A color separation transparency of one color selected from the primary colors, black and white, comprising:

a partial image in said one color, said transparency being transparent in areas representing said one color and opaque in areas representing all other colors;

said partial image in said one color being screened such that said partial image comprises a plurality of screen dots, the average apertures of said screen dots in each portion of said image corresponding approximately to the average density of said one color in said portion;

said screen dots being arranged in said partial image in a pattern of repeating units, each unit comprising an array of more than two non-overlapping screen dots each having an aperture different from the other screen dots, the arrangement of the screen dots in all of said units being identical.

2. A color separation transparency as claimed in claim 1, wherein each unit comprises four screen dots, each having a different aperture.

3. A combination of a plurality of the color separation transparencies of claim 1, each comprising a partial image in a different color, and each having identically repeating units of screen dots, said units of each transparency being mutually offset in increments of one screen period when said transparencies are superposed in true register, such that the screen dots of corresponding aperture in each unit of each transparency are superposed over screen dots of different aperture in the other transparencies.

4. A combination of color separation transparencies, each comprising a color separation of a color selected from the primary colors, black and white, each transparency comprising a partial image in said color, said partial image in said color being screened such that said partial image comprises a plurality of screen dots produced by copying through a screen film of regularly repeating elements of same size, the screen dots of each of said transparencies being shifted relative to the other of said transparencies, such that when said transparencies are superposed in true register, the respective screen dots of the transparencies are non-overlapping, even in image areas corresponding to secondary colors.

5. A combination as claimed in claim 4, wherein, when said transparencies are superposed in true register, the screen dots of the respective transparencies are mutually offset by half a screen period.

6. A combination as claimed in claim 4, comprising four transparencies, the respective screen dots of which are mutually offset by half a screen period along a closed path of lines forming a rectangle.

7. A process for the preparation of a color separation transparency as defined by claim 1 from an original, which comprises the steps of first exposing the original to a photographic film with light of the color complementary to the desired primary color of the color separation to produce a color separation positive; and second, reprinting the resulting color separation positive to give a color separation negative, one of said first or second steps comprising the exposure of a recording material through a screen comprising a plurality of identically repeating units of screen dots of different aperture and constant period, such that the image in said color separation negative comprises a plurality of dots.

8. A process for the preparation of a plurality of color separation transparencies as defined in claim 3, which comprises the steps of exposing a light-sensitive film through a stationary screen comprising a plurality of identical repeating units of more than two screen dots of mutually different aperture and constant period, and offsetting a movable original from a first position for every further color separation exposure for other colors cyclically along a closed path returning to said first position, by an offset length which corresponds to the product of the image scale $S_2/S_1$ and of the screen dot period R of the screen, wherein $S_1$ is the lens-to-film distance and $S_2$ is the original-to-lens distance.

9. A process for the preparation of a plurality of color separation transparencies as defined by claim 4, which comprises the steps of exposing a light-sensitive film through a stationary screen comprising a plurality of identical screen elements of same aperture, and offsetting a movable original from a first position for every further color separation exposure for other colors cyclically along a closed path returning to said first position, by an offset length which corresponds to the product of the image scale $S_2/2S_1$ and of the screen dot period R of the screen, wherein $S_1$ is the lens-to-film distance and $S_2$ is the original-to-lens distance.

10. A process for the preparation of color separation transparencies as defined by claim 7, with the aid of color separations for cyan, magneta and yellow, which comprises the step of obtaining the color separation transparency for the desired primary color yellow, red, blue and green by masking the color separation negative for yellow, magenta and cyan or masking the superposed color separation negatives for yellow and cyan with the color separation positives of the remaining colors, including the positives for the colors black and white.

11. A process as claimed in claim 10, which comprises the step of exposing a photographic film successively, in true register, in contact with the color separation negatives for the colors yellow, red, blue, green and black, in order to obtain the color separation negative for the color white.

12. A process for the preparation of color separation transparencies as defined by claim 4 from an original containing secondary colors, which comprises the steps of scanning the original by image dots in the spectral ranges for blue, green, yellow and red, determining the partial images of the original for the colors white and black, storing the color values for the scanned image dots and computing therefrom that color, which predominates at each image dot, and the magnitude of the color intensity, and controlling the recording of the associated screen signal dots on the color separation transparency corresponding to the values of the particular dominant color at the image dots.

13. A process as claimed in claim 12, which comprises, for color adaptation in one screen dot when scanning the original, the step of taking an average over several adjacent image dots associated with the screen dot in such a way that initially only screen ground signals for a certain color are given as output, while the remaining colors are stored and their signal values are allocated in a fixed order as screen dots to the particular associated color separation and given as output.

* * * * *